United States Patent
Choi et al.

(10) Patent No.: US 8,264,905 B2
(45) Date of Patent: Sep. 11, 2012

(54) NONVOLATILE MEMORY DEVICE USING VARIABLE RESISTIVE ELEMENT

(75) Inventors: Byung-Gil Choi, Yongin-si (KR); Du-Eung Kim, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 322 days.

(21) Appl. No.: 12/406,441

(22) Filed: Mar. 18, 2009

(65) Prior Publication Data

US 2009/0237986 A1    Sep. 24, 2009

(30) Foreign Application Priority Data

Mar. 19, 2008    (KR) .................. 10-2008-0025525

(51) Int. Cl.
*G11C 16/08* (2006.01)
(52) U.S. Cl. .......... 365/230.06; 365/185.13; 365/185.23
(58) Field of Classification Search ............. 365/185.13, 365/185.23, 185.25, 230.06, 203, 163, 148, 365/230.03
See application file for complete search history.

(56) References Cited

U.S. PATENT DOCUMENTS

| | | | | |
|---|---|---|---|---|
| 4,939,696 | A * | 7/1990 | Katsuo et al. | 365/230.03 |
| 5,808,500 | A * | 9/1998 | Kalpakjian | 327/321 |
| 6,031,784 | A * | 2/2000 | Ong | 365/230.06 |
| 6,407,942 | B2 * | 6/2002 | Aritomi et al. | 365/63 |
| 6,493,268 | B1 * | 12/2002 | Khouri et al. | 365/185.23 |
| 6,515,893 | B1 * | 2/2003 | Bhavnagarwala | 365/154 |
| 2005/0270883 | A1 * | 12/2005 | Cho et al. | 365/230.03 |
| 2006/0181955 | A1 | 8/2006 | Shinozaki et al. | |
| 2007/0058425 | A1 * | 3/2007 | Cho et al. | 365/163 |
| 2007/0165479 | A1 | 7/2007 | Rehm | |
| 2007/0189104 | A1 * | 8/2007 | Cho et al. | 365/230.06 |
| 2007/0206409 | A1 * | 9/2007 | Choi et al. | 365/163 |

FOREIGN PATENT DOCUMENTS

KR    1020040051197    6/2004
KR    1020060101695    9/2006

* cited by examiner

*Primary Examiner* — Douglas King
(74) *Attorney, Agent, or Firm* — F. Chau & Associates, LLC

(57) ABSTRACT

A nonvolatile memory device using variable resistive element with reduced layout size and improved performance is provided. The nonvolatile memory device comprising: a main word line; multiple sub-word lines, wherein each of the sub-word line is connected to multiple nonvolatile memory cells; and a section word line driver which controls voltage level of the multiple sub-word lines, wherein the section word line driver includes multiple pull-down elements which are connected to each of the multiple sub-word lines and a common node and a selection element which is connected to the common node and the main word line.

9 Claims, 7 Drawing Sheets

NONVOLATILE MEMORY DEVICE USING VARIABLE RESISTIVE ELEMENT

CROSS REFERENCE TO RELATED APPLICATION

This application claims priority to Korean Patent Application No. 10-2008-0025525 filed on Mar. 19, 2008, in the Korean Intellectual Property Office, the disclosure of which is incorporated herein by reference in its entirety.

BACKGROUND OF THE INVENTION

1. Technical Field

The present disclosure relates to nonvolatile memory devices, more particularly, to nonvolatile memory deices whose memory cells include variable resistive material.

2. Description of the Related Art

The bit data of DRAM (Dynamic RAM) and flash memory devices are usually determined by the level of charge stored in memory cells. However, in the case of some nonvolatile memory devices bit data can be determined by the level of current flowing through resistive materials of memory cells. These nonvolative memory devices include PRAM (Phase change Random Access Memory), RRAM (Resistive RAM), and MRAM (Magnetic RAM). The variable resistive material may be phase-change materials such as chalcogenide alloy (PRAM), or MTJ (Magnetic Tunnel Junction) thin films.

For example, PRAM changes phase-change material into a crystal state or an amorphous state through heating process. The phase-change material in the crystal state has a low resistance and is defined to retain bit data "0," while the phase-change material in the amorphous status has high resistance, and is defined to retain bit data "1."

FIG. 1 illustrates a conventional nonvolatile memory device.

Referring to FIG. 1, the conventional nonvolatile memory device includes multiple memory cell blocks BLK0, BLK1, multiple section word line driver blocks SWD_BLK0-SWD-_BLK2, and multiple conjunction blocks CNJ0-CNJ2. Conjunction blocks are distinguished from multiple section word line driver blocks in that they are disposed adjacent to an input/output circuit whereas multiple section word line driver blocks are disposed adjacent to memory cell blocks.

Each of the memory cell blocks BLK0-BLK2 includes an array of nonvolatile memory cells. A main word line MWL is disposed across the multiple cell blocks BLK0-BLK2 and is coupled to each of the section word line driver blocks SWD-_BLK0-SWD_BLK2. Each of the section word line driver blocks includes multiple section word line drivers, and each of the section word line drivers controls voltage level of corresponding multiple sub-word lines SWL00-SWLn0, SWL01-SWLn1 and SWL02-SWLn2 by responding to voltage level of the main word line and voltage levels of block select signal E00-En0, E01-En1 and E02-En2. Each of multiple sub-word lines SWL00-SWLn0, SWL01-SWLn1 and SWL02-SWLn2 is disposed across memory cell blocks and is coupled to corresponding multiple nonvolatile memory cells.

Each section word line driver pulls up the voltage level of the sub-word lines SWL00-SWLn0, SWL01-SWLn1 and SWL02-SWLn2 through pull-up elements U0-Un, and pulls down the voltage level of the sub-word lines SWL00-SWLn0, SWL01-SWLn1 and SWL02-SWLn2 through pull-down elements D0-Dn. The pull-up elements U0-Un can be PMOS transistors, and the pull-down elements D0-Dn can be NMOS transistors.

In conventional nonvolatile memory devices, the pull-up elements U0-Un and the pull-down elements D0-Dn operate by responding to the level of voltage applied to a main word line MWL. Selection elements S0-Sn, located in conjunction blocks CNJ0-CNJ2, are connected to each of the pull-down elements D0-Dn in series. The selection elements S0-Sn operate by responding to block select signals E00-En0, E01-En1, and E02-En2 which include block information provided by a block select signal generating circuit 10. The selection elements S0-Sn can be NMOS transistors. Since each sources node of the pull-down elements D0-Dn needs to be connected to each drain node of the pull-down elements S0-Sn, interconnecting lines may limit compact layout of the pull-down elements D0-Dn. Furthermore, the lengthy interconnection between pull-down elements D0-Dn and pull-down elements S0-Sn results in increased parasitic resistance R which deteriorates performance of nonvolatile memory devices.

SUMMARY OF THE INVENTION

An exemplary embodiment of the present invention includes a main word line; multiple sub-word lines, wherein each of the sub-word line is connected to corresponding multiple nonvolatile memory cells; and a section word line driver which includes multiple pull-down elements and a selection element, wherein each drain node of the multiple pull-down elements is connected to corresponding sub-word line, and each source node of the multiple pull-down elements is connected to a common node, and the drain node of the selection element is connected to the common node.

An exemplary embodiment of the present invention includes a main word line; a sub-word line which is connected to corresponding multiple nonvolatile memory cells; and a section word line driver which includes a pull-down element and a selection element, wherein the pull-down element is connected to corresponding sub-word line and operates by responding to a block select signal which includes block information, and the selection element is connected between the pull-down element and a ground, and operates by responding to voltage applied to the main word line.

An exemplary embodiment of the present invention includes multiple memory cell blocks, wherein multiple sub-word lines are connected to corresponding memory cells; a first section word line driver block, wherein a first pull-down element is connected to corresponding sub-word line and operates by responding to a first block select signal which includes a first block information, and a first selection element is connected between the first pull-down element and a ground and is coupled to a main word line; and a second section word line driver block, wherein a pull-up element and a second pull-down element are connected to the sub-word line and operate by responding to a second block select signal which includes a second block information, and a second selection element which is connected between the second pull-down element and the ground and is coupled to a main word line.

BRIEF DESCRIPTION OF THE DRAWINGS

The above and other features and advantages of the present invention will become apparent by describing in detail exemplary embodiments thereof with reference to the attached drawings in which.

DETAILED DESCRIPTION OF EXEMPLARY EMBODIMENTS

The present invention will now be described more fully hereinafter with reference to the accompanying drawings, in which exemplary embodiments of the invention are shown. However, the invention may be embodied in many different forms and should not be construed as being limited to the embodiments set forth herein.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present.

Hereinafter, a phase change random access memory PRAM is described in exemplary embodiments of the present invention for purpose of illustration. The description is equally applicable to other nonvolatile memory devices such as resistive RAMs (RRAMs) and ferroelectric RAMs (FRAMs).

Figure 2:
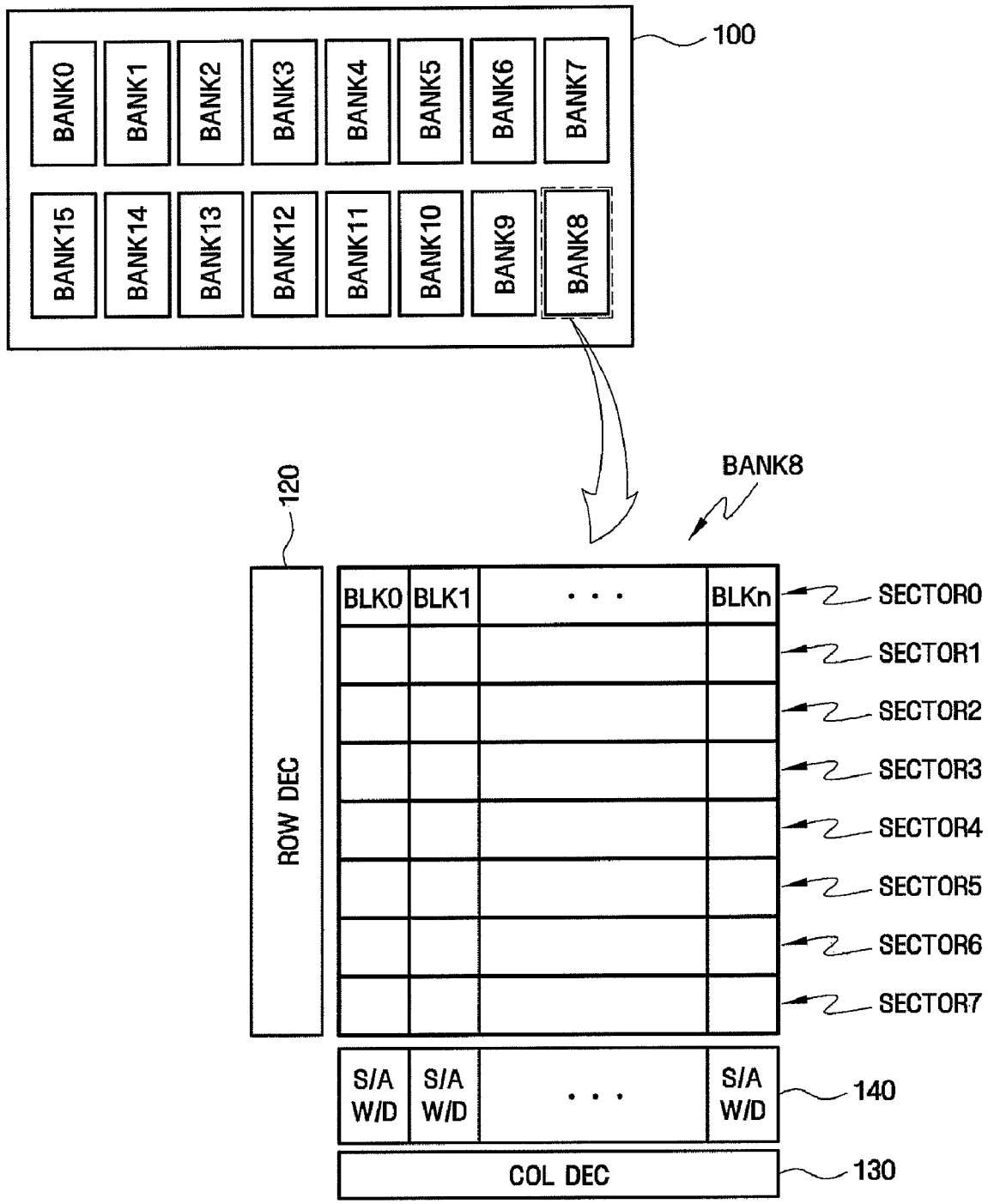
FIG. 2 is an exemplary block diagram illustrating a nonvolatile memory device according to exemplary embodiments of the present invention.

FIG. 2 is an exemplary block diagram illustrating a nonvolatile memory device according to an exemplary embodiment of the present invention.

Referring to FIG. 2, a nonvolatile memory device 100 includes multiple memory banks BANK0-BANK15, a row decoder 120, a column decoder 130, and an input/output circuit 140.

The multiple memory banks BANK0-BANK15 are hierarchically structured. Each of memory banks BANK0-BANK15 includes multiple memory sectors SECTOR0-SECTOR7, and each of the memory sectors SECTOR0-SECTOR7 includes multiple memory cell blocks BLK0-BLKn.

Hereinafter, the present invention is described in BANK8. However, the description is equally applicable to other memory banks.

The row decoder 120 defines row address of the memory bank BANK8 and the column decoder 130 defines column address of the memory bank BANK8. The input/output circuit 140 includes a sense amplifiers S/As and a write drivers W/Ds, and performs write and/or read operations on the memory bank BANK8.

Figure 3:
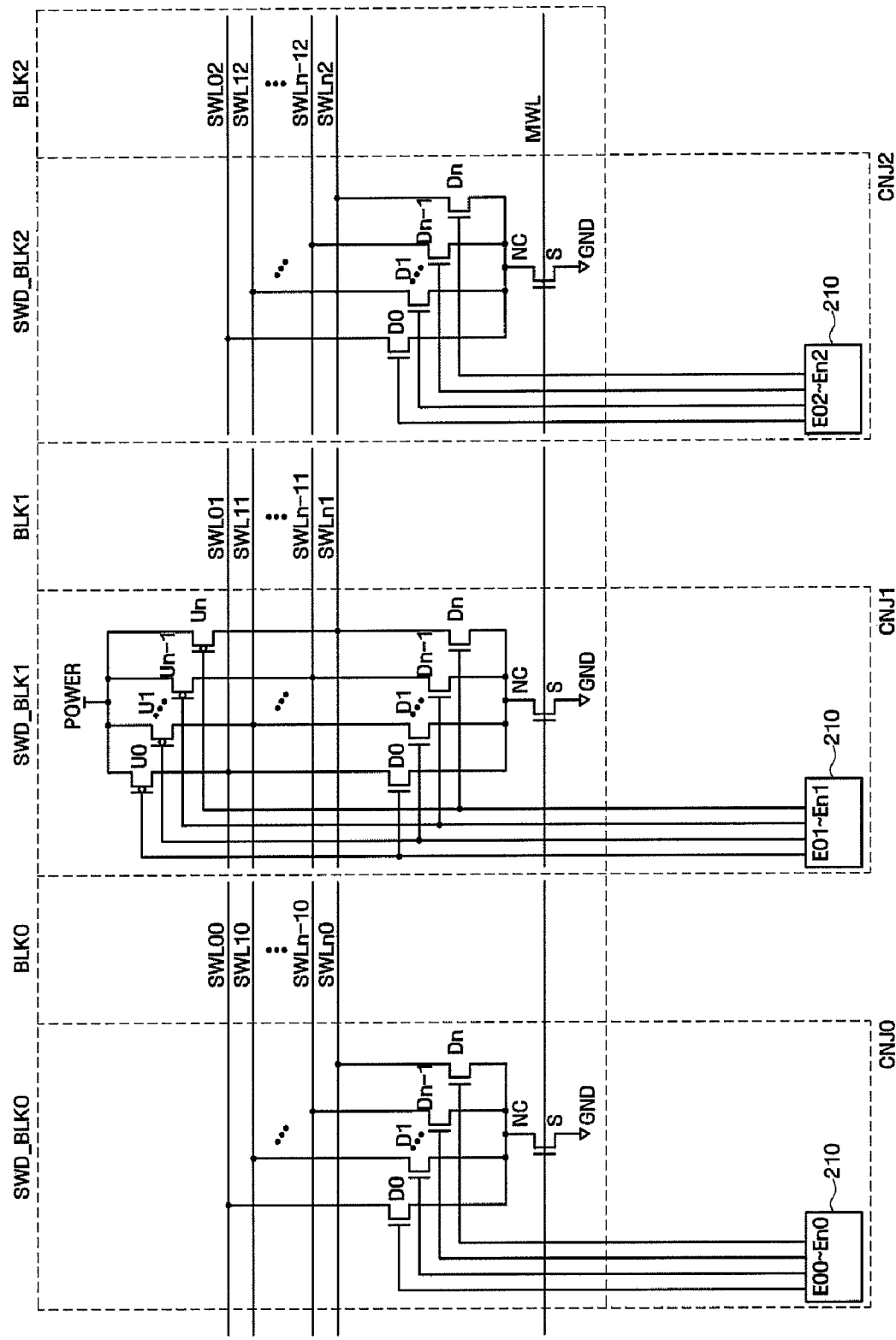
FIG. 3 is a circuit diagram illustrating a nonvolatile memory device according to an exemplary embodiment of the present invention.
Figure 4:
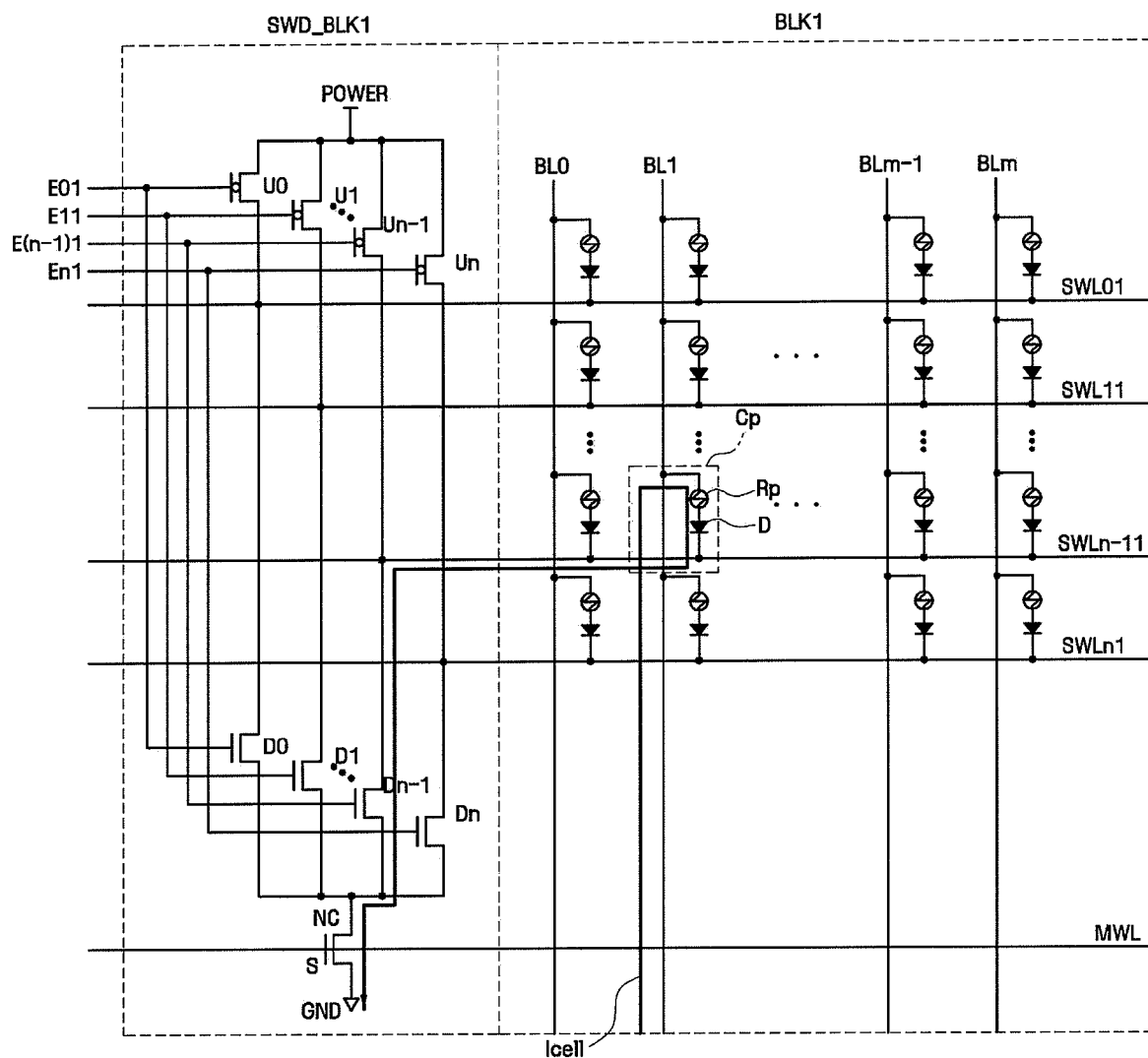
FIG. 4 is a circuit diagram illustrating a section word line driver block SWD_BLK1 and a memory cell block BLK1 shown in FIG. 3.

FIG. 3 is a circuit diagram illustrating a nonvolatile memory device according to an exemplary embodiment of the present invention, and it especially illustrates the memory sector SECTOR0 in FIG. 2. FIG. 4 is a circuit diagram illustrating a section word line driver block SWD_BLK1 and the memory cell block BLK1 in FIG. 3 in detail. The present invention is described in the memory sector SECTOR0 among the multiple memory sectors SECTOR0-SECTOR7 as an example; however, the description is equally applicable to other memory sectors.

Referring to FIGS. 3 and 4, the nonvolatile memory device according to an exemplary embodiment of the present invention includes multiple memory cell blocks BLK0, BLK1, multiple section word line driver blocks SWD_BLK0-SWD_BLK2, and multiple conjunction blocks CNJ0-CNJ2.

In each of the multiple memory cell blocks BLK0-BLK2, multiple nonvolatile memory cells Cp is formed in a matrix shape.

Each of multiple nonvolatile memory cells Cp is located in the area where a word line and a bit line are crossed. Here, the word line can be implemented in a hierarchical word line structure comprising a main word line MWL and multiple sub-word lines SWL00-SWLn0, SWL01-SWLn1 and SWL02-SWLn2. The main word line MWL traverses the multiple memory cell blocks BLK0-BLK2, and is coupled to each of the section word line driver blocks SWD_BLK0-SWD_BLK2. Each of the section word line driver blocks includes multiple section word line drivers, and each of the section word line drivers controls voltage level of corresponding sub-word lines SWL0-SWLn. Although the bit lines BL0-BLm in the drawings are implemented in single layer structure, the description is also equally applicable to a hierarchical bit line structure which comprises a main bit line and multiple sub-bit lines.

The nonvolatile memory cell Cp includes a variable resistive element Rp and an access element D. Variable resistive element Rp includes a phase change material whose resistance is variable depending on data stored in the cell. An access element D controls flow of current Icell through Rp. In the drawing, a diode-controlled PRAM cell is illustrated as an example of the nonvolatile memory cell; however, it is not necessarily limited to a diode. For example, a MOS transistor can be used as the access element D.

The variable resistive element Rp is connected between the bit line BL0-BLm and the access element D, an anode of the access element D is coupled with the variable resistive element Rp and a cathode is connected to the sub-word line SWL00-SWLn0, SWL01-SWLn1 and SWL02-SWLn2. However, the connection between the variable resistive element Rp and the access element D can be changed depending on applications. Various materials can be used as phase change material. For example, two element compounds such as GaSb, InSb, InSe, $Sb_2Te_3$, or GeTe, or three element compounds such as GeSbTe, GaSeTe, InSbTe, $SnSb_2Te_4$, or InSbGe, or four element compounds such as AgInSbTe, (GeSn)SbTe, GeSb(SeTe), $Te_{81}Ge_{15}Sb_2S_2$ can be used.

The section word line driver blocks SWD_BLK0-SWD_BLK2 can be placed between memory cell blocks BLK0-BLK2. A section word line driver is located in each of the section word line driver blocks SWD_BLK0-SWD_BLK2, and each of the section word line driver controls voltage levels of corresponding sub-word lines SWL00-SWLn0, SWL01-SWLn1 and SWL02-SWLn2.

According to an exemplary embodiment of the present invention, some section word line drivers (for example, SWD_BLK1) include pull-up elements U0-U1, pull-down elements D0-Dn, and selection element S, whereas, other section word line driver blocks (for example, SWD_BLK0 and SWD_BLK2) include pull-down elements D0-Dn and selection element S without pull-up elements.

The layout area of the section word line driver blocks SWD_BLK0, SWD_BLK2 can be reduced significantly because the layout area of PMOS transistor is larger than the layout area of NMOS transistor. Furthermore, the reduction of layout area in section word line driver blocks SWD_BLK0 and SWD_BLK2 is not limited only to the area occupied by pull up elements (PMOS transistor) U0-Un, but additionally the space between the pull-up elements (PMOS transistor) U0-Un and the pull-down elements (NMOS transistor) D0-Dn is eliminated.

In an alternative embodiment of present invention where layout area is not limited, section word line driver blocks SWD_BLK0-SWD_BLK2 may include the pull-up elements.

Hereinafter, the structure and operations of the section word line driver are described in detail using the section word line driver in section word line driver block SWD_BLK1.

The pull-up elements U0-Un are connected between the corresponding sub-word lines SWL00-SWLn0, SWL01-SWLn1 and SWL02-SWLn2 and drive voltage POWER, and operate by responding to block select signals E01-En1 which include block information. The pull-down elements D0-Dn are connected between the corresponding sub-word lines SWL00-SWLn0, SWL01-SWLn1 and SWL02-SWLn2 and a common node NC, and operate by responding to the block select signals E01-En1. The selection element S is connected between the common node NC and the ground GND, and operates by responding to the voltage applied to the main word line MWL. According to an exemplary embodiment of the present invention, a PMOS transistor is used to illustrate the pull-up elements U0-Un and an NMOS transistor is used to illustrate the pull-down elements D0-Dn and the selection element S, respectively.

Here, the block information activates one of the memory cell blocks BLK0-BLK2 by controlling the level of corresponding sub-word line SWL00-SWLn0, SWL01-SWLn1 and SWL02-SWLn2. For example, the section word line block driver block SWD_BLK0 can receive the block select signals E00-En0 which include block information that specifies the memory cell block BLK0, and the section word line driver block SWD_BLK1 can receive block select signals E01-En1 which include block information that specifies the memory cell block BLK1. In another example, where the section word line driver block SWD_BLK1 is placed between the memory cell block BLK0 and the memory cell block BLK1 and the section word line driver block SWD_BLK1 can receive block select signals E01-En1 which include block information that specifies both of the memory cell blocks BLK0 and BLK1, the section word line driver block SWD_BLK1 can activate both BLK0 and BLK1.

In particular, according to an exemplary embodiment of the present invention, the sources of the pull-down elements D0-Dn of a section word line driver are electrically connected within the area of a section word line driver block instead of being connected to the selection element S which is located in a conjunction block. Thus, the layout area of the pull-down elements D0-Dn is reduced.

Figure 1:
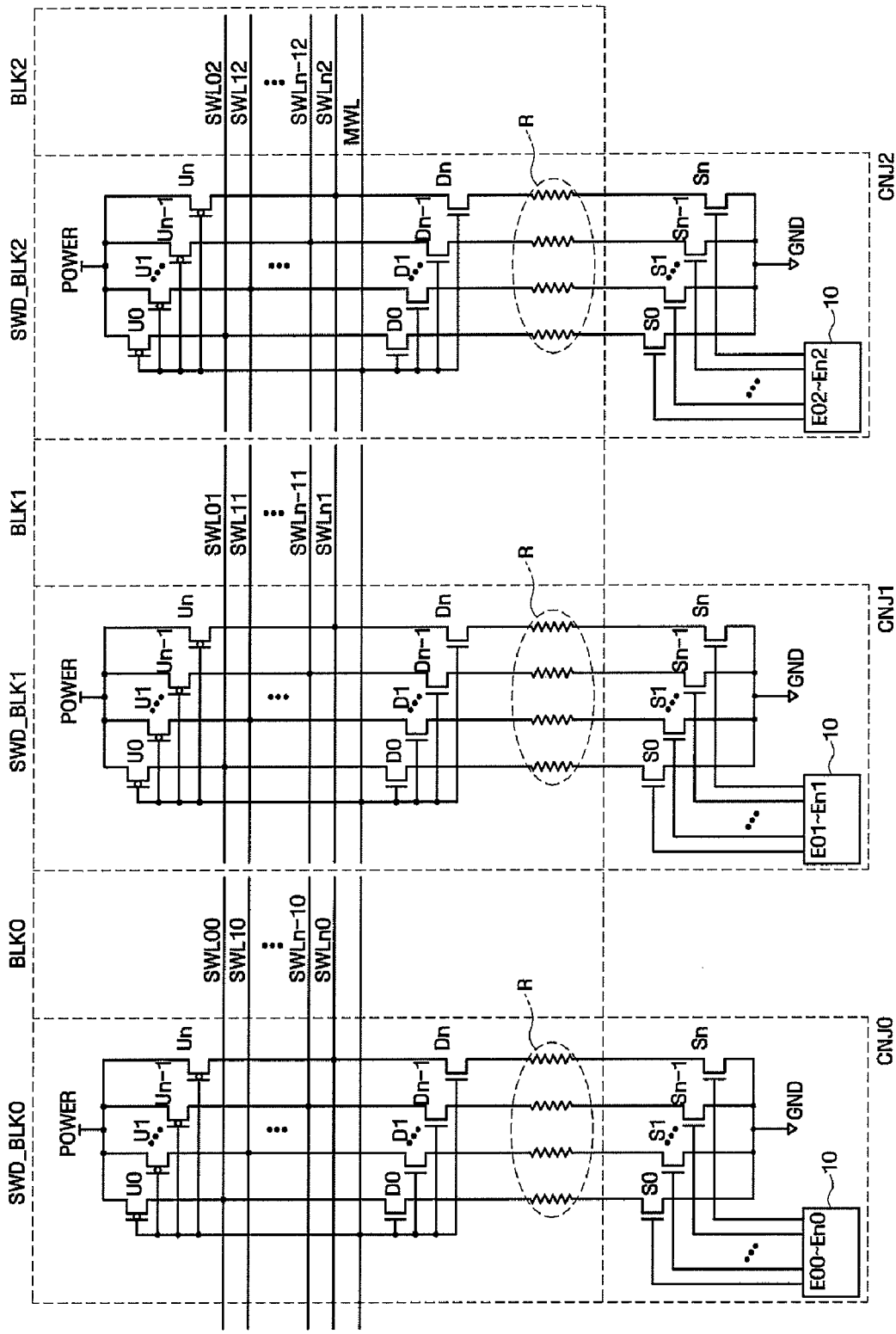
FIG. 1 is a circuit diagram illustrating a conventional nonvolatile memory device.

Furthermore, according to an exemplary embodiment of the present invention, the selection element S and the ground GND can be included in the section word line driver blocks SWD_BLK0-SWD_BLK2, instead of being included in a conjunction block and, the distance between the pull-down elements D0-Dn and the ground GND may become short. As a result, compared to the conventional nonvolatile memory device (refer to FIG. 1), parasitic resistance between the pull-down elements D0-Dn and the ground GND can be significantly reduced.

During read and write operations of a nonvolatile memory device, the current Icell flows through the selected (to be read or written) nonvolatile memory cell Cp. As illustrated in FIG. 4, if the nonvolatile memory cell Cp connected between the sub-word line SWLn-11 and the bit line BL1 is selected, the current Icell flows through the bit line BL1, the selected nonvolatile memory cell Cp, the sub-word line SWLn-11, the pull-down element Dn-1, the selection element S, and the ground GND. Though the current Icell level mainly depends on stored data of the selected nonvolatile memory cell Cp, it is also affected by the resistance of the word line SWLn-11, the pull-down element Dn-1, and the selection element S. Large resistance between the pull-down elements D0-Dn and the ground GND, as illustrated in the conventional nonvolatile memory device (refer to FIG. 1), reduces the current Icell level. In the nonvolatile memory device according to an exemplary embodiment of the present invention, the resistance reduction due to the short interconnection distance between the pull-down elements D0-Dn and the ground GND, results in performances improvement during read and write operations.

A block select signal generating circuit 210 that provides the block information signals E01-En1 can be located in the conjunction block CNJ1.

Figure 5:
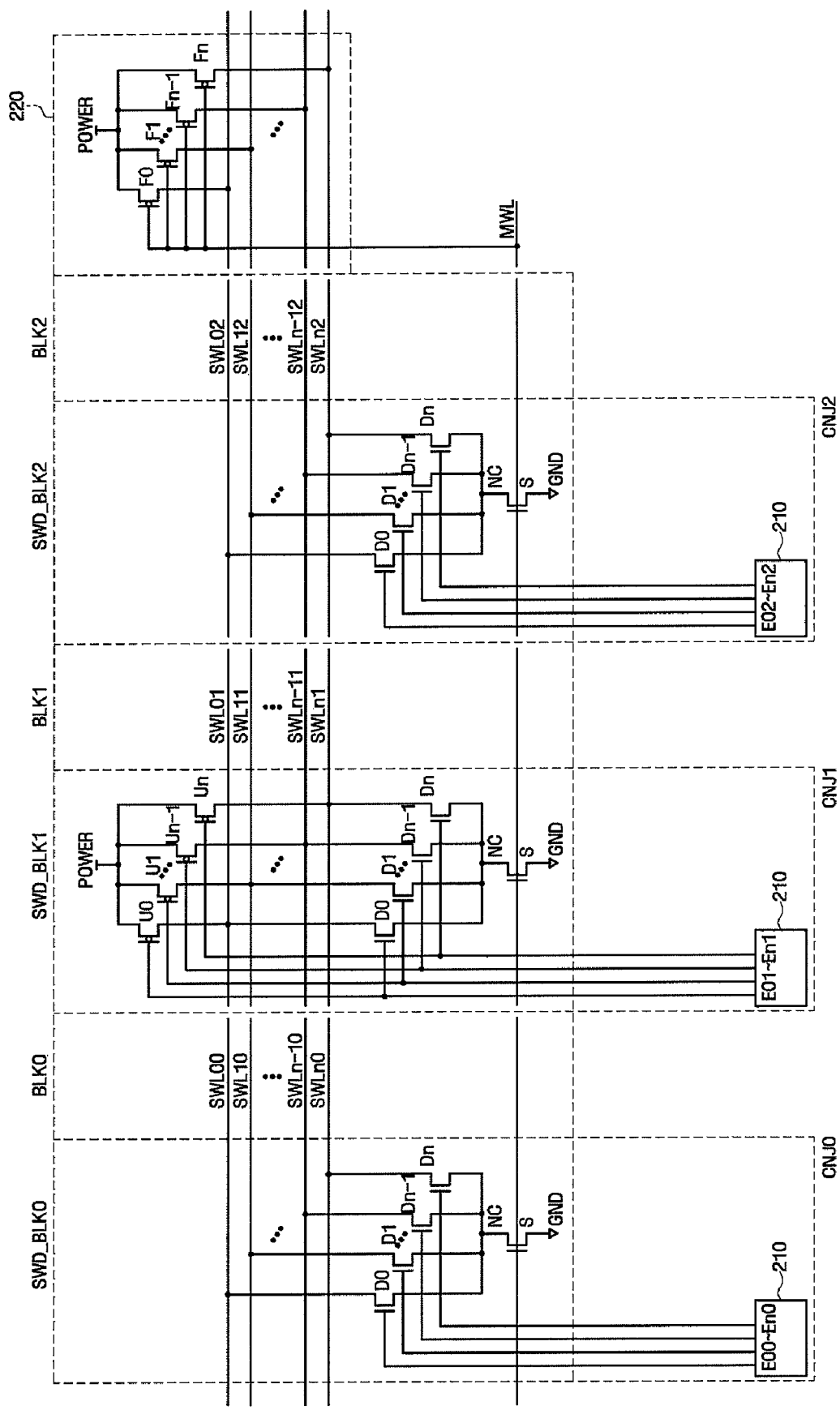
FIG. 5 is a circuit diagram illustrating a nonvolatile memory device according to another exemplary embodiment of the present invention.
Figure 6A:
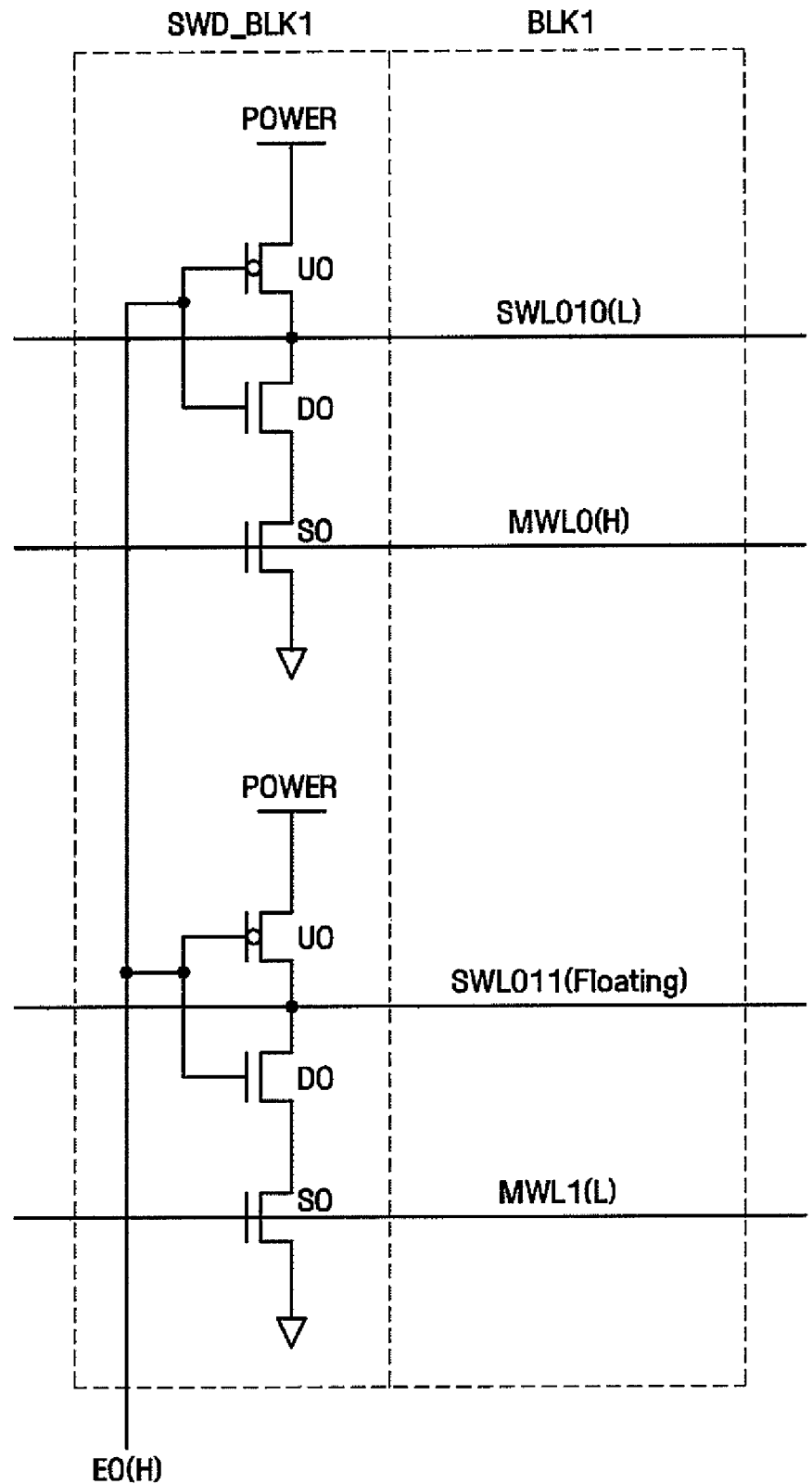
FIGS. 6A and 6B are circuit diagrams illustrating operations of the nonvolatile memory device shown in FIG. 5.
Figure 6B:
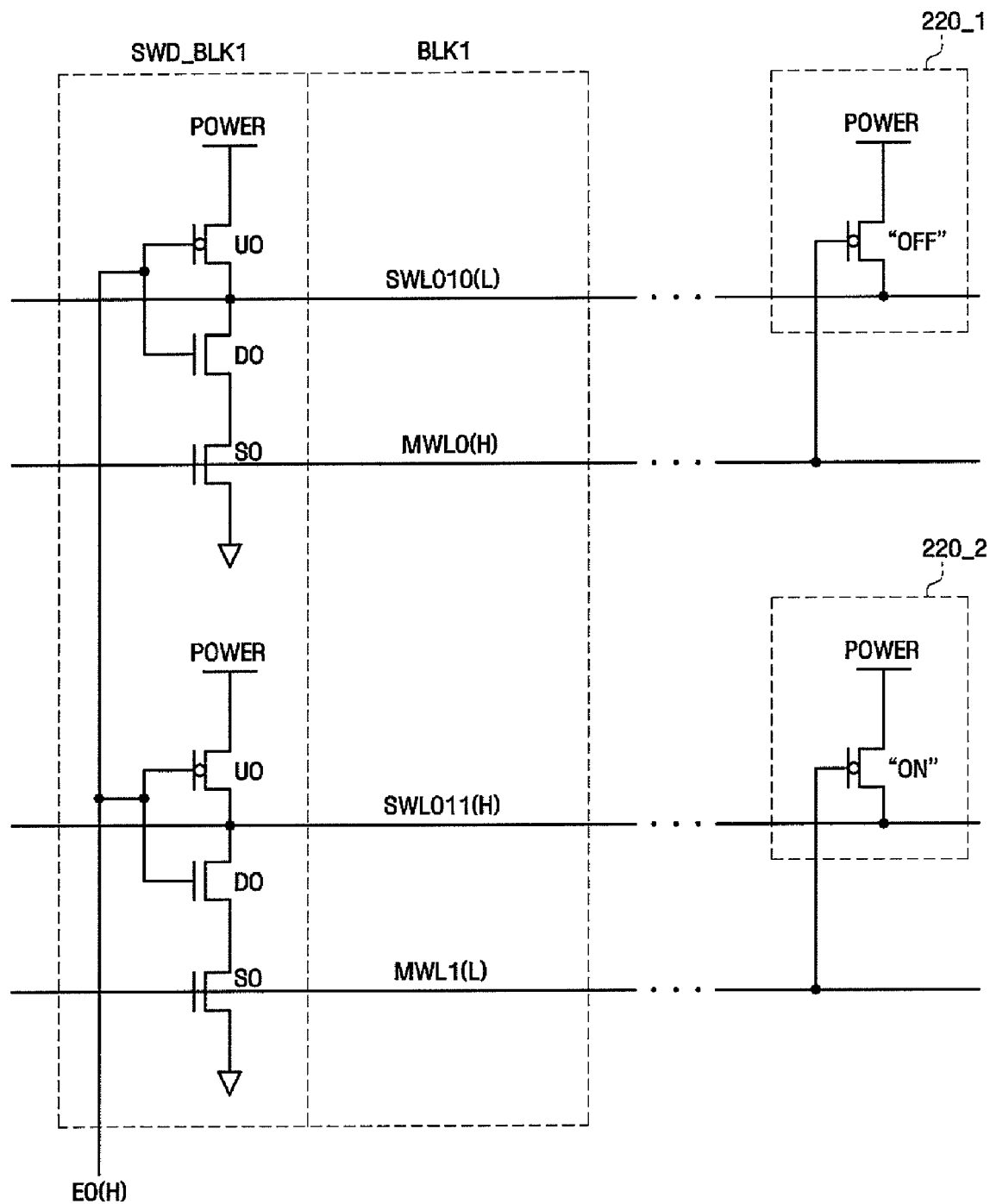

FIG. 5 is a circuit diagram illustrating a nonvolatile memory device according to another exemplary embodiment of the present invention. FIGS. 6A and 6B are circuit diagrams illustrating operations of the nonvolatile memory device shown in FIG. 5.

Referring to FIG. 5, a nonvolatile memory device according to this exemplary embodiment of the present invention is different from that shown in FIG. 2 in that it additionally includes a floating prevention circuit 220 that prevents sub-word lines SWL00-SWLn0, SWL01-SWLn1 and SWL02-SWLn2 from floating.

The floating prevention circuit 220 can include multiple floating prevention elements F0-Fn connected to the corresponding sub-word lines SWL00-SWLn0, SWL01-SWLn1 and SWL02-SWLn2. Such floating prevention elements F0-Fn can be PMOS transistors which are connected between drive voltage POWER and the corresponding sub-word lines SWL00-SWLn0, SWL01-SWLn1 and SWL02-SWLn2 and operate by responding to the voltage applied to a main word line MWL.

FIG. 6A is a circuit diagram illustrating operations of the nonvolatile memory device without the floating prevention circuit 220 and FIG. 6B is a circuit diagram illustrating operations of the nonvolatile memory device with the floating prevention circuit 220. In the FIGS. 6A and 6B, the parts related to the main word lines MWL0, MWL1 and the sub-word lines SWL010, SWL011 are illustrated for convenience in understanding. Information in the parenthesis indicates states of the main word lines MWL0, MWL1, the sub-word lines SWL010, SWL011, and a block select signal E0 which includes block information.

Referring to FIG. 6A, in order to select the nonvolatile memory cell connected to the sub-word line SWL010, the block select signal E0 and the main word line MWL0 need to be high level, and the main word line MWL1 needs to be low level. The block select signal E0 is connected to a section word line driver which is connected to the sub-word line SWL010 and the section word line driver which is connected to the sub-word line SWL011. Thus, the sub-word line SWL011 becomes floating state.

Referring to FIG. 6B, although the block select signal E0 including block information and the main word line MWL0 are set to high level, and the main word line MWL1 is set to low level to select the nonvolatile memory cell connected to the sub-word line SWL010, the sub-word line SWL011 does not become floating state. The sub-word line SWL011 becomes a high level because the main word line MWL1 is a low level and the floating prevention circuit 220_2 which is connected to the main word line MWL1 is turned on.

In contrast, since the main word line MWL0 is at a high level, the floating prevention circuit 220_1 which is connected to the main word line MWL0 is turned off.

While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A nonvolatile memory device comprising:
   multiple memory cell blocks;
   multiple section word line driver blocks;
   a main word line traversing the multiple memory cell blocks and being coupled to each of the multiple section word line driver blocks;
   a floating prevention circuit which includes elements each directly connected to a corresponding sub-word line and the main word line, wherein
   wherein each of the multiple memory cell blocks includes the multiple sub-word lines connected to corresponding nonvolatile memory cells located in the each of the multiple memory cell blocks; and
   each of the multiple section word line driver blocks includes a section word line driver including multiple pull-down transistors and a selection transistor, wherein each of the multiple pull-down transistors has one node connected to a corresponding sub-word line and another node connected to a common node, and the selection transistor has a gate connected to the main word line, one node connected to the common node and another node connected to a ground.

2. The nonvolatile memory device of claim 1, wherein each of the pull-down transistors operates by responding to a block select signal which includes block information.

3. The nonvolatile memory device of claim 1, wherein the selection transistor operates by responding to voltage applied to the main word line.

4. The nonvolatile memory device of claim 2, further comprising a block select signal generating circuit which provides the multiple pull-down transistors with the block select signals and wherein the multiple pull-down transistors and the selection transistor are placed in a section word line driver block and the block select signal generating circuit is placed in a conjunction block.

5. The nonvolatile memory device of claim 1, wherein each of the multiple pull-down transistors is an NMOS transistor which is connected between the corresponding sub-word line and the common node and operates by responding to a block select signal.

6. The nonvolatile memory device of claim 1, wherein the section word line driver includes multiple pull-up transistors which are connected with each of the multiple sub-word lines and the drive voltage source.

7. The nonvolatile memory device of claim 6, wherein each of the pull-up transistors operates by responding to a block select signal.

8. The nonvolatile memory device of claim 6, wherein each of the multiple pull-up transistors is a PMOS transistor which is connected between the sub-word line and the drive voltage source and operates by responding to a block select signal.

9. The nonvolatile memory device of claim 1, wherein the nonvolatile memory cell is a diode-controlled PRAM (phase change RAM) cell.

* * * * *